United States Patent [19]

McCarthy et al.

[11] Patent Number: 4,658,091
[45] Date of Patent: Apr. 14, 1987

[54] INDUCTOR HOUSING

[75] Inventors: Christopher I. McCarthy, Streamwood; David W. Currier, Algonquin, both of Ill.

[73] Assignee: Motorola, Inc., Schaumburg, Ill.

[21] Appl. No.: 720,122

[22] Filed: Apr. 4, 1985

[51] Int. Cl.⁴ .................. H01F 15/02; H05K 5/02
[52] U.S. Cl. .................. 174/52 PE; 336/65; 336/96
[58] Field of Search .......... 174/52 PE, 52 S; 336/65, 92, 96; 338/197, 228, 230, 269, 315

[56] References Cited

U.S. PATENT DOCUMENTS

| | | | |
|---|---|---|---|
| 2,343,675 | 3/1944 | Kenyon | 336/65 |
| 3,151,210 | 9/1964 | Hennessey | 174/52 PE X |
| 3,246,272 | 4/1966 | Wiley | 336/65 X |
| 3,570,119 | 3/1971 | Baker | 174/52 PE X |
| 3,838,316 | 9/1974 | Brown et al. | 174/52 PE X |

Primary Examiner—Arthur T. Grimley
Assistant Examiner—D. A. Tone
Attorney, Agent, or Firm—Steven G. Parmelee

[57] ABSTRACT

An inductor housing having a platform for supporting an inductor and a standoff unit for supporting the platform away from a conductor board such that various electrical components can be installed on the conductor board between the inductor platform and the conductor board surface. The inductor housing also has a hole disposed therethrough such that the inductor housing may serve as an insulating standoff support member for connecting a conductor board to a chassis.

10 Claims, 8 Drawing Figures

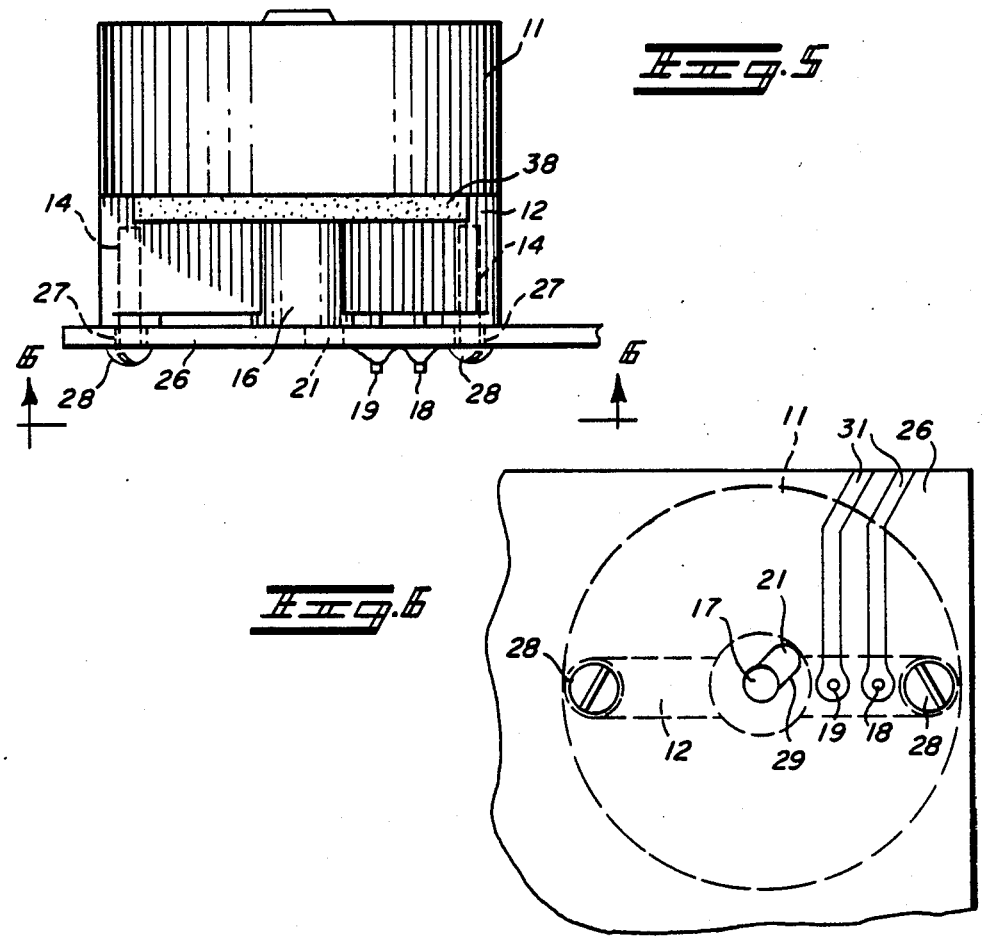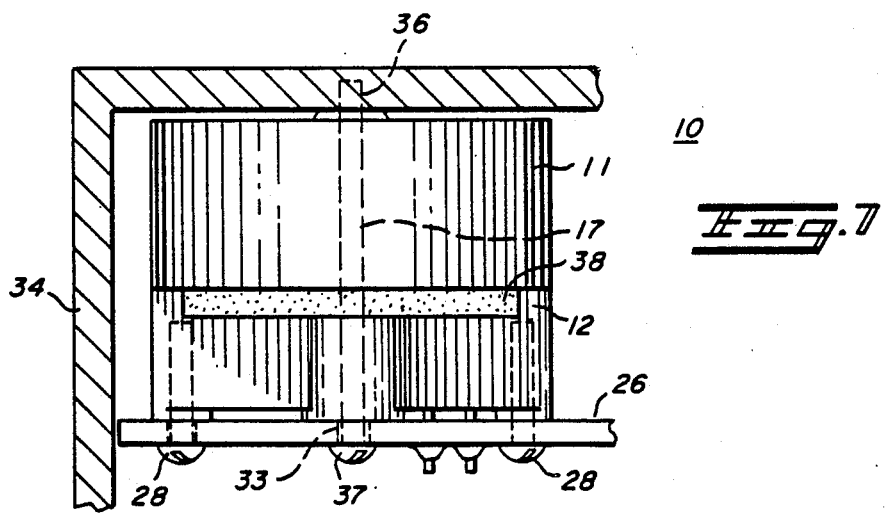

INDUCTOR HOUSING

TECHNICAL FIELD

This invention relates generally to inductor housings, and more particularly to such housing as are suitable for mounting on conductor boards such as printed circuit boards.

BACKGROUND ART

Inductors are often large and bulky in comparison to other electrical components as are available today. This bulk constitutes a disadvantage when space limitations constitute a critical design consideration. This problem can be appreciated by making reference to FIG. 1, which constitutes a depiction of a prior art toroidal inductor housing as mounted to a conductor board (B) (in this case a printed circuit board). The inductor housing (A) mounts directly to the printed circuit board (B) and therefore requires a dedication of a substantial portion of the printed circuit board surface area. As a result, other components (C) must be positioned about it, sometimes requiring awkward physical positioning and non-desirable conductor patterns on the conductor side of the printed circuit board (B).

In view of these problems, designers may be forced to compromise by utilizing a smaller than adequate inductor in order to meet space constraints. In the alternative, larger inductors may be utilized if mounted off the conductor board. Unfortunately, the latter solution entails a number of problems that can be as difficult, if not more difficult, then the problem resolved by resort thereto.

There therefore exists a need for an inductor housing that allows an inductor of adequate size for the purpose intended to be used while simultaneously avoiding a large dedication of conductor board surface area.

In addition, a secondary need can also be identified with respect to this specification. More particularly, conductor boards such as the ones discussed above are typically mounted on a chassis. In general, the conductor board will be positioned in a standoff orientation with respect to the chassis. Various prior art standoff mechanisms will adequately perform this function. Nevertheless, such standoffs generally require a dedication of conductor board surface area which, under some circumstances, may be scarce or not available. Under such conditions, the necessary provision of a standoff mechanism can be a frustrating design criteria.

Yet another need can be identified with respect to this specification. Physically large capacitors are often used in conjunction with large inductors, the likes of which have been discussed above. Such large capacitors are often difficult to securely mount on a conductor board, and when subjected to a vibratory environment, may require the use of special clips or cable ties. This, of course, can add to the labor and material costs of constructing the product in question. Also, such mechanical fasteners can consume conductor board surface area that may already be in short supply.

SUMMARY OF INVENTION

These needs and others are substantially met by provision of the inductor housing disclosed in this specification. This inductor housing includes in general an inductor platform and a standoff member. The inductor platform serves to support an inductor, and the standoff member serves to operably connect the platform to a conductor board such that the platform, and hence the inductor, is positioned distally with respect to the conductor board. So positioned, and by selecting a standoff member having a relatively minimal area requirement with respect to conductor board surface, space can be made available for mounting various electrical components on the surface area of the conductor board between the conductor board and the inductor platform.

In one embodiment of this invention, the inductor housing has a substantially circular cross section, and the standoff member has a substantially rectangular cross section that is smaller in area than the cross section of the inductor housing. The standoff member has holes formed therein for alignment with holes provided through the conductor board such that threaded fastening members can be utilized to connect the standoff member to the conductor board. In addition, electrical leads can be provided through the standoff member to allow the inductor supported by the inductor platform to be electrically connected as appropriate with respect to the conductor board.

Further, a second mounting unit can be provided such that the inductor housing itself, including the inductor platform and the standoff member, can be utilized as a standoff to allow the conductor board to be fastened in a standoff orientation with respect to a chassis. To accommodate this particular function, the inductor housing has a hole disposed therethrough such that the fastening member can be inserted therethrough to interconnect the conductor board, the inductor housing, and the chassis.

Finally, foam or other resilient material can be affixed to the undersurface of the inductor platform. This foam can contact other components (such as large capacitors) as may be mounted on the conductor board underneath the inductor platform to aid in physically restraining such components in place. This avoids the need for special fasteners that might otherwise be required.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein:

FIG. 5 comprises a front elevational view of the inductor housing as mounted on a conductor board;

FIG. 6 comprises a bottom plan view of FIG. 5 as taken along the plane designated by the reference character 6;

FIG. 7 comprises a cut-away front elevational detail view of the inductor housing as utilized to mount a conductor board to a chassis.

BEST MODE FOR CARRYING OUT THE INVENTION

Figure 1:
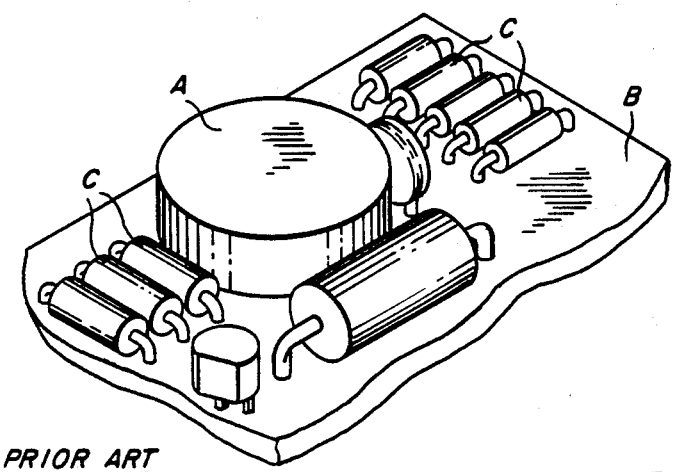
FIG. 1 comprises a perspective view of a prior art inductor housing as installed on a conductor board.
Figure 2:
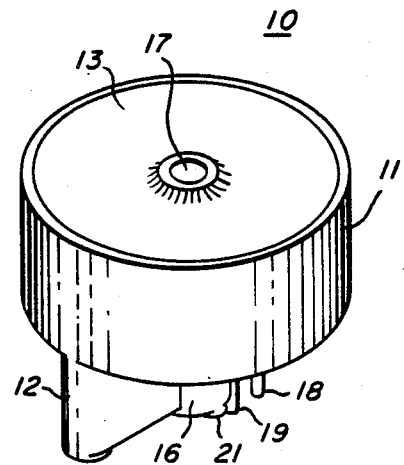
FIG. 2 comprises a top perspective view of an inductor housing as formed in conjunction with the invention.

Referring now to the drawings, and in particular to FIG. 2, the apparatus of the invention may be seen as depicted generally by the numeral 10. The housing (10) includes generally an inductor platform (11) and a standoff member (12). These generally described components will now be described in greater detail in seriatim fashion.

For purposes of this disclosure, the inductor housing (10) has been constructed about a toroidal-shaped inductor. The toroidal inductor fits inside a vessel formed by the inductor platform (11). The inductor platform (11) has an opening (13) sealed by use of a potting material such as epoxy to seal and retain the inductor within the inductor platform (11).

Figure 3:
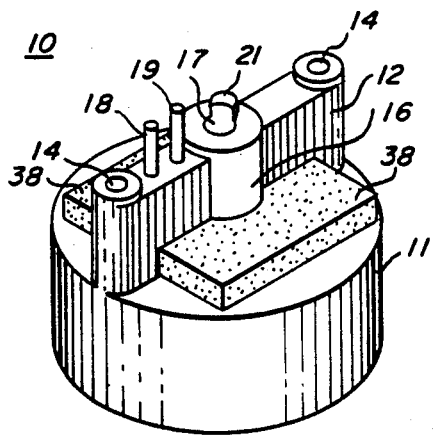
FIG. 3 comprises a bottom perspective view of the inductor housing.
Figure 4:
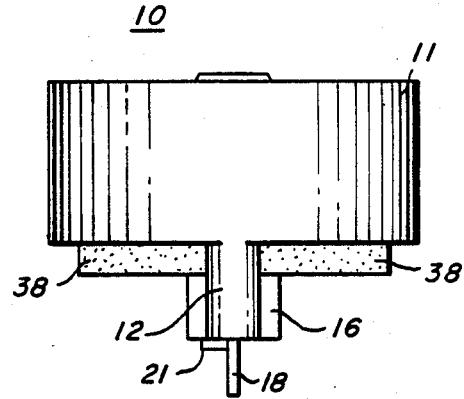
FIG. 4 comprises a side elevational view of the inductor housing.

With reference to FIGS. 2, 3, and 4, the standoff member (12) comprises a wall like member that extends the entire diameter of the inductor platform (11). The outer edges of the standoff member are rounded in this embodiment and have a hole (14) (as perhaps best shown in FIG. 3) disposed therethrough. In addition, the central portion of the standoff member (12) includes a thicker cylindrical shaped section (16) for accommodating yet a third hole (17) and for providing greater structural support for purposes to be made more clear below. It may also be noted that the hole (17) that extends through the central portion of the standoff member (12) also extends through the inductor platform (11).

Two electrical leads (18 and 19) are provided through the standoff member (12) for connection to the inductor disposed within the inductor platform (11). Also, an installation guide (21) has been disposed on the distal surface of the standoff member (12). This installation guide (21) comprises a shaped tab that may be suitably disposed within a similarly shaped cavity as provided in a conductor board in a manner to be described below to ensure correct placement of the housing (10) with respect to the conductor board.

In the particular embodiment described above, the housing (10) may essentially be comprised of an integral molded member, and may be formed of a non-conductive material such as plastic. The dimensions of the housing (10) may of course be varied to accommodate inductors of various sizes and shapes.

Referring now to FIGS. 5 and 6, installation of the housing (10) with respect to a conductor board (26) will now be described.

With respect to FIG. 5, the housing (10) may be positioned proximal to a conductor board (26) such as a printed circuit board having conductor paths formed on one side thereof pursuant to well known prior art techniques. In addition, the conductor board (26) includes two holes (27) located to align with the holes (14) formed through the standoff member (12). Threaded fastening members (28) may be disposed through these aligned holes (27 and 14) to securely fasten the housing (10) to the conductor board (26).

In addition, with reference to FIG. 6, a notch or cavity (29) can be formed in or through the surface of the conductor board (26) to accommodate the installation guide (21) as provided on the distal surface of the standoff member (12). Finally, the electrical leads (18 and 19) can be positioned through holes provided therefor in the conductor board and electrically connected to conductor paths (31) on the surface of the conductor board (26) in conformance with well known prior art techniques.

Figure 8:
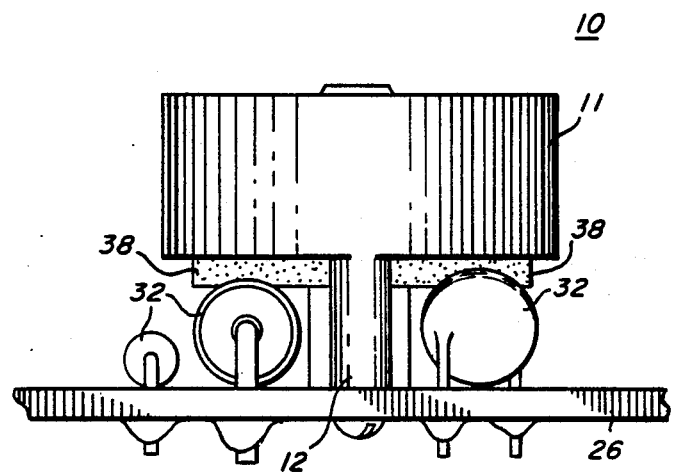
FIG. 8 comprises a side elevational view of the inductor housing as mounted to a printed circuit board and with other components affixed on the surface of the conductor board between the conductor board and the inductor platform.

Referring to FIG. 8, this positioning of the housing (10) results in an acceptable coupling of the toroidal inductor contained within the inductor platform (11) to appropriate conductor paths (31) on the conductor board (26), while at the same time allowing other components (32) to be mounted on the conductor board surface between the conductor board (26) and the inductor platform (11). Therefore, by use of this device, no undue sacrifices need be made either with respect to inductor size or placement of the inductor with respect to the conductor board (26) itself.

Referring now to FIG. 7, an additional function of the device (10) can be described. The housing (10) can be utilized to fasten a conductor board (26) to a chassis (34) in a standoff orientation. To accomplish this, the hole (17) provided through the standoff member (12) and the inductor platform (11) may be co-linearly aligned with a hole (33) provided through the conductor board (26) and a hole (36) provided in the chassis (34). So aligned, a threaded fastening member (37) may be disposed therethrough to satisfactorily couple all three components together. So utilized, the inductor housing (10) serves as a standoff member and alleviates the need for any additional standoff structures that would otherwise require use of conductor board surface area.

Referring to FIGS. 3 and 8, adhesive backed foam (38) can be attached to the inductor platform (11). With the inductor housing (10) mounted on a conductor board (26), this foam (38) can contact components (32) as may be mounted on the conductor board (26) to aid in physically retaining such components (32) in place. If desired, the component contacting surface of the foam (38) can also be coated with an adhesive to provide additional retaining capability.

The above aspects of the invention have of course been described generally and with respect to the particular embodiment depicted. Those skilled in the art will recognize numerous modifications and variations of this invention that could be practiced without departing from the features and spirit of the invention. Therefore, the scope of this invention should not be considered as being limited to the particular embodiment set forth, except as such limitations may specifically be set forth in the claims.

We claim:

1. An inductor housing for use in connecting an inductor to a conductor board, comprising:
   (a) platform means for supporting said inductor;
   (b) standoff means having a smaller cross section than said platform means for operably connecting said platform means to said conductor board such that said platform means and said inductor are positioned distally with respect to said conductor board such that electrical components can be mounted on said conductor board between said platform means and said conductor board; and
   (c) foam means operably affixed to said platform means for contacting at least one of said electrical components to aid in physically retaining said contacted electrical component in place on said conductor board.

2. The inductor housing of claim 1 wherein said foam means includes adhesive means for adhesively contacting said at least one of said electrical components.

3. The inductor housing of claim 1 wherein said platform means has a substantially circular cross section.

4. The inductor housing of claim 1 wherein said standoff means has a substantially rectangular cross section.

5. The inductor housing of claim 1 wherein said platform means and said standoff means are comprised of an integral member.

6. The inductor housing of claim 1 wherein said platform means and said standoff means are comprised of substantially non-conductive material.

7. The inductor housing of claim 1 wherein electrical leads are provided through said standoff means such that an inductor supported by said platform means can be electrically connected with respect to said conductor board.

8. An inductor housing for use in connecting an inductor to a conductor board, said conductor board having at least two holes formed therethrough, comprising:
 (a) platform means for supporting said inductor; and
 (b) standoff means for operably connecting said platform means to said conductor board such that said platform means and said inductor are positioned distally with respect to said conductor board, said standoff means having at least two substantially unobstructed holes formed therethrough, such that at least some of the holes in said standoff means can be aligned with at least some of the holes in said conductor board, such that fastening members may be positioned therethrough to connect said standoff means to said conductor board.

9. The inductor housing of claim 8 and further including threaded fastening members for disposition through said holes in said standoff means and said conductor board.

10. An inductor housing for use in connecting an inductor to a conductor board having at least three holes disposed therethrough, and for connecting said conductor board to a chassis having at least one hole disposed therein, said inductor housing comprising:
 (a) platform means for supporting said inductor, said platform means being formed of substantially non-conductive material and having at least one substantially unobstructed hole formed therethrough; and
 (b) standoff means attached to said platform means and being formed of substantially non-conductive material and having at least one substantially unobstructed hole formed therethrough and at least two additional holes formed therein, such that;
  (i) said standoff means can be positioned with respect to said conductor board to align at least two of said at least two additional holes in said standoff means with a matching member of said at least three holes in said conductor board, such that fastening members can be received through said aligned holes to thereby aid in connecting said standoff means to said conductor board; and
  (ii) at least one of said holes through said conductor board, said standoff means, said platform means, and said chassis are then aligned to receive a fastening member therethrough to thereby aid in connecting said conductor board to said chassis through said standoff means and said platform means.

* * * * *